（12） United States Patent
Ma et al.

(10) Patent No.: US 8,698,263 B2
(45) Date of Patent: *Apr. 15, 2014

(54) THREE-DIMENSIONAL ARRAYS COMPOSED OF FLEXIBLE PIN DIODES AND IMAGING DEVICES MADE THEREFROM

(75) Inventors: Zhenqiang Ma, Middleton, WI (US); Max G. Lagally, Madison, WI (US); Hao-Chih Yuan, Lakewood, CO (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/542,886

(22) Filed: Jul. 6, 2012

(65) Prior Publication Data

US 2012/0273913 A1 Nov. 1, 2012

Related U.S. Application Data

(63) Continuation of application No. 12/478,369, filed on Jun. 4, 2009, now Pat. No. 8,232,617.

(51) Int. Cl.
*H01L 27/14* (2006.01)
*H01L 31/0203* (2006.01)
*H01L 31/102* (2006.01)
*H01L 31/00* (2006.01)
*H01L 31/06* (2012.01)

(52) U.S. Cl.
USPC ........... 257/431; 257/433; 257/435; 257/442; 257/458; 257/459; 257/465; 257/E31.061; 250/370.14

(58) Field of Classification Search
USPC ...................................... 250/370.14
See application file for complete search history.

(56) References Cited

U.S. PATENT DOCUMENTS

| 6,534,768 | B1 * | 3/2003 | Ciurczak et al. | 250/339.02 |
| 7,186,611 | B2 * | 3/2007 | Hsu et al. | 438/237 |
| 8,232,617 | B2 * | 7/2012 | Ma et al. | 257/458 |
| 2004/0008149 | A1 * | 1/2004 | Killen et al. | 343/795 |
| 2009/0001469 | A1 * | 1/2009 | Yoshida et al. | 257/347 |

* cited by examiner

*Primary Examiner* — Michael Jung
(74) *Attorney, Agent, or Firm* — Bell & Manning, LLC

(57) ABSTRACT

Flexible lateral p-i-n ("PIN") diodes, arrays of flexible PIN diodes and imaging devices incorporating arrays of PIN diodes are provided. The flexible lateral PIN diodes are fabricated from thin, flexible layers of single-crystalline semiconductor. A plurality of the PIN diodes can be patterned into a single semiconductor layer to provide a flexible photodetector array that can be formed into a three-dimensional imaging device.

15 Claims, 13 Drawing Sheets

THREE-DIMENSIONAL ARRAYS COMPOSED OF FLEXIBLE PIN DIODES AND IMAGING DEVICES MADE THEREFROM

CROSS-REFERENCE TO RELATED APPLICATIONS

The present application is a continuation of U.S. patent application Ser. No. 12/478,369 that was filed Jun. 4, 2009, the entire contents of which is hereby incorporated by reference.

GOVERNMENT SUPPORT

This invention was made with United States government support awarded by the following agencies: USAF/AFOSR FA9550-06-1-0487 and NSF 0520527. The United States government has certain rights in this invention.

FIELD

The present invention relates to flexible lateral p-i-n diodes, arrays of flexible p-i-n diodes and devices incorporating arrays of flexible p-i-n diodes.

BACKGROUND

When a device records an image, light passes through a lens and lands on a photodetector—a light-sensitive material like the sensor in a digital camera. However, a lens bends the light and curves the focusing plane. In a digital camera, the point where the focusing plane meets the flat sensor will be in focus, but the image becomes more distorted the farther it is from that focus point.

High-end digital cameras correct this problem by incorporating multiple panes of glass to refract light and flatten the focusing plane. However, such lens systems are large, bulky and expensive.

SUMMARY

One aspect of the invention provides a lateral PIN diode comprising a flexible layer of single-crystalline semiconductor on a flexible substrate, the layer of single-crystalline semiconductor having a thickness no greater than about 400 nm and comprising an intrinsic semiconductor region disposed laterally between a n-type doped region and a p-type doped region. In one embodiment, the layer of single-crystalline semiconductor is a layer of single-crystalline germanium.

The layer of single-crystalline semiconductor from which the PIN diodes are fabricated can have a polygon-shaped perimeter having at least five sides. For example, the PIN diodes can have a hexagon-shaped perimeter or a pentagon-shaped perimeter. The polygons can be regular or irregular polygons.

Another aspect of the invention provides a photodiode array comprising a plurality of flexible lateral PIN diodes on a flexible substrate, the PIN diodes comprising flexible layers of single-crystalline semiconductor having a polygon-shaped perimeter with at least five sides arranged in a honeycomb pattern. In one embodiment of the photodetector array the plurality of PIN diodes include PIN diodes comprising layers of single-crystalline semiconductor having a hexagon-shaped perimeter and PIN diodes comprising layers of single-crystalline semiconductor having a pentagon-shaped perimeter.

In some embodiments, the perimeter of the photodiode array defines a plurality of extensions configured to form a curved photodiode array upon application of a flexing force. The curved photodiode array may be a substantially hemispherical array. In one illustrative embodiment, the array includes a central section from which the extensions extend, the central section comprising a central pentagonal PIN diode, five irregular hexagonal PIN diodes forming a ring around the central PIN diode, and five pairs of irregular pentagonal PIN diodes disposed around the circumference of the ring of irregular hexagonal PIN diodes. Such an embodiment may include five extensions.

In other embodiments, the central section comprises a central hexagonal PIN diode and a ring of PIN diodes around the central PIN diode, the ring of PIN diodes comprising three irregular hexagonal PIN diodes and three irregular pentagonal PIN diodes in an alternating configuration.

Yet another aspect of the invention provides a three-dimensional flexible photodiode array that is substantially hemispherically-shaped, comprising a plurality of flexible lateral PIN diodes on a flexible substrate. In this three-dimensional array, the PIN diodes comprise layers of single-crystalline semiconductor having polygon-shaped perimeters with at least five sides such that they can be arranged in a honeycomb pattern.

Flexible switches (e.g., microwave switches) made from flexible, lateral PIN diodes are also provided. One embodiment of such a switch comprises a first lateral PIN diode and a second lateral PIN diode connected to the first lateral PIN diode in a switch configuration, such as a shunt-series switch configuration. Each of the first and the second lateral PIN diodes in the switch include a flexible layer of single-crystalline semiconductor on a flexible substrate, the layer of single-crystalline semiconductor comprising an intrinsic region disposed laterally between an n-type doped region and a p-type doped region. The layers of single-crystalline semiconductor are sufficiently thin to render the switch flexible. Thus, in some embodiments the layers of single-crystalline semiconductor have a thickness of no greater than about 500 nm, no greater than about 400 nm, or no greater than about 300 nm.

Still another aspect of the invention provides laser radar (LADAR) devices that include a flexible vertical cavity light emitting source and a plurality of flexible photodetectors configured in a ring around the flexible vertical cavity light emitting source, the photodetectors comprising PIN diodes comprising a flexible layer of single-crystalline semiconductor. In some embodiments, the vertical cavity light emitting source of the LADAR devices includes a flexible vertical cavity light emitting source comprising: a lower reflector comprising a first patterned membrane comprising an array of holes; an active region disposed over the lower reflector and spaced from the active region by at least one electrically conductive contacts; and an upper reflector comprising a second patterned membrane comprising an array of holes disposed over the active region and spaced from the active region by at least one electrically conductive contact.

A plurality of the LADAR devices can be arranged on a flexible substrate to provide a flexible LADAR array. The LADAR devices can have a polygon-shaped perimeter with at least 5 sides. For example, the LADAR devices can have pentagon or hexagon-shaped perimeters. In some embodiments, the LADAR devices are arranged in a honeycomb pattern to form an array. In some embodiments, at least a portion of the flexible LADAR array takes the form of a three-dimensional curved array, such as a spherical or hemispherical array. Different vertical cavity light emitting sources in the array can be configured to emit light at different wavelengths and different photodetectors in the array can be configured to detect radiation over different wavelength ranges.

DETAILED DESCRIPTION

The present invention relates to flexible lateral p-i-n ("PIN") diodes, arrays of flexible PIN diodes and devices incorporating arrays of PIN diodes. The flexible lateral PIN diodes include a photoactive layer fabricated from thin, flexible semiconductor layers (e.g., layers of single-crystalline germanium) that can be released from an underlying substrate after at least some degree of semiconductor processing has been carried out. A plurality of the PIN diodes can be integrated into a single semiconductor layer to provide a flexible diode array that can be formed into a three-dimensional array, such as a hemispherical array.

Figure 1:
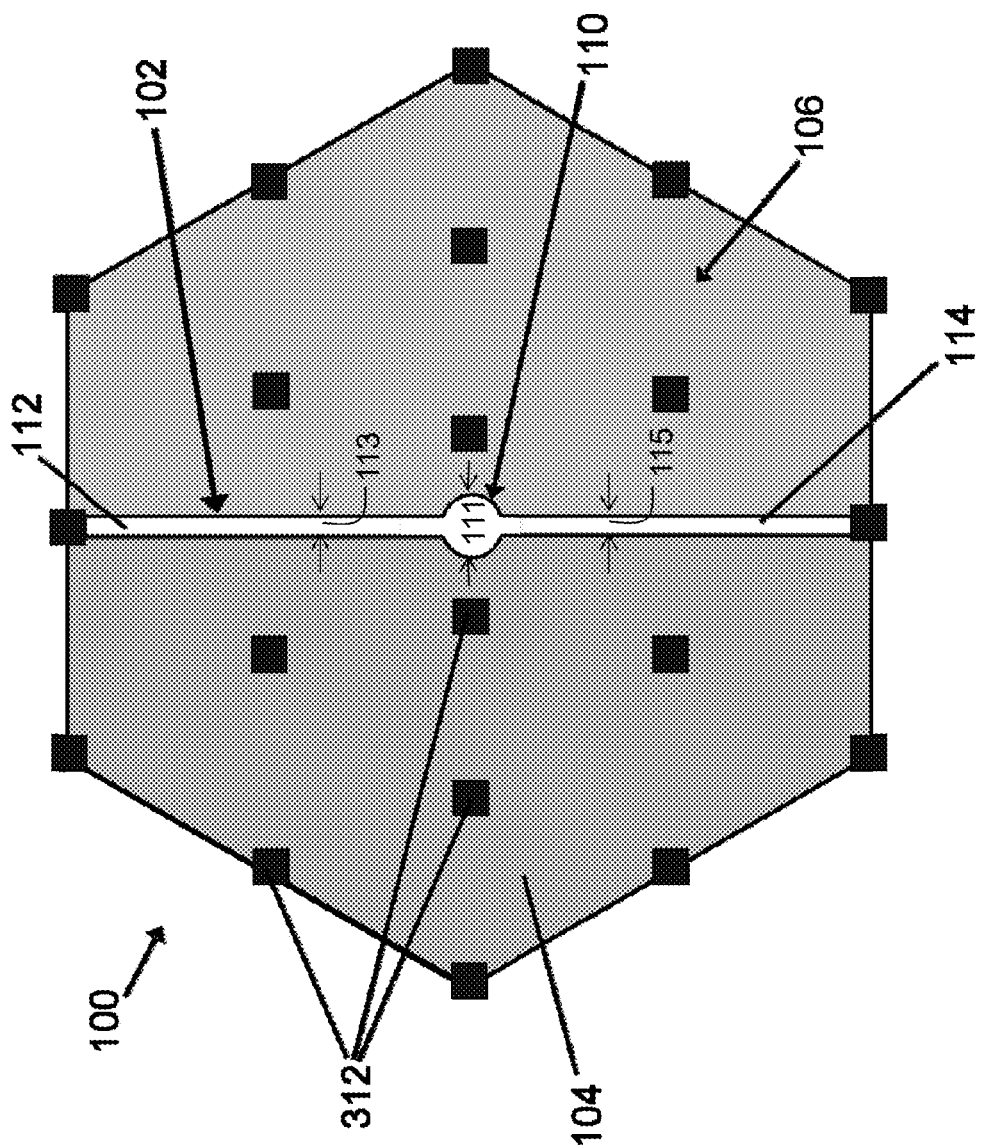
FIG. 1 shows a top-view of a schematic diagram of one embodiment of a lateral PIN diode.
Figure 2:
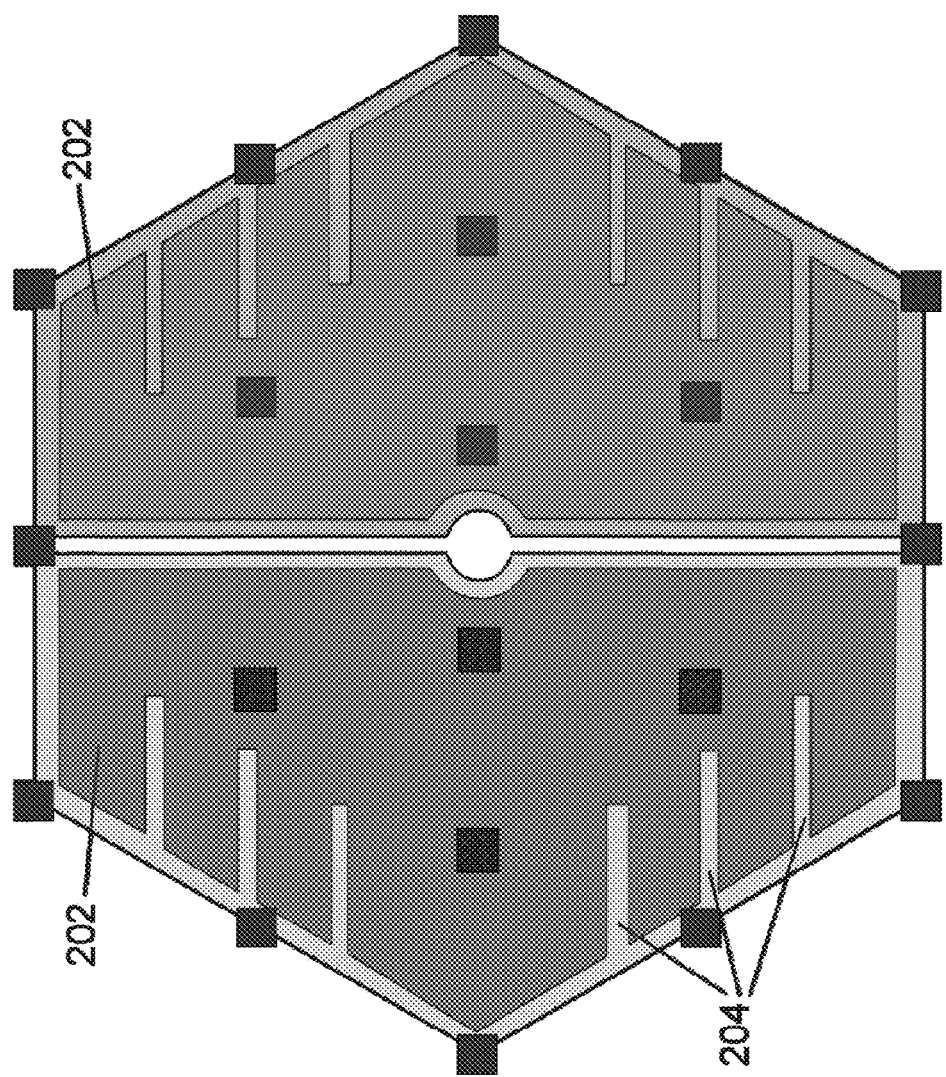
FIG. 2 shows the PIN diode of FIG. 1 with an electrically-conductive material 202 on the n-type and p-type doped regions.

One aspect of the present invention provides lateral PIN diodes. The PIN diodes are composed of thin layers of flexible, single-crystalline semiconductor materials ("nanomembranes"). The nanomembranes are optionally supported on a flexible support substrate, such as a polymeric film or metal foil. FIG. 1 shows a top-view of a schematic diagram of one embodiment of a lateral PIN diode 100. The photoactive layer of the PIN diode includes an intrinsic region 102 disposed laterally between an n-type doped region 104 and a p-type doped region 106. As shown in FIG. 2, the PIN diode can also include an electrically-conductive material 202 on the n-type and p-type doped regions in order to provide electrical contacts for the PIN diodes. Single-crystalline semiconductor materials from which the lateral PIN diodes can be fabricated, include Group IV semiconductor materials, such as germanium (Ge), silicon (Si) or alloys of Ge and Si (GeSi). Elements that can be used to dope the layer of single-crystalline semiconductor material to create the n-type and p-type doped regions include, but are not limited to, phosphorous (n-type dopant) and boron (p-type dopant).

In some embodiments, the PIN diodes have a regular or irregular polygon-shaped perimeter having at least five sides. For example, the PIN diodes can have a pentagon-shaped perimeter or a hexagon-shaped perimeter, as depicted in the embodiment of FIG. 1.

As shown in FIG. 1, the intrinsic region of the PIN diode may have a non-uniform width along its length. For example, the intrinsic region can include a central section 110 disposed between a first flanking section 112 and a second flanking section 114 to form a circular "eye" 110 in the intrinsic region. Increasing the area of the central region may be advantageous in order to increase the size of the active region and improve the absorption efficiency of a PIN diode that is operated as a photodetector.

The dimensions of the PIN diode of FIG. 1 can vary. By way of illustration only, typical dimension can be as follows: length of side ~5-150 µm; diameter 111 of central section ~1-100 µm; and diameters of flanking sections ~0.01-10 µm.

The layer of single-crystalline semiconductor material is sufficiently thin to provide a flexible photoactive layer. The degree of flexibility should be sufficient to ensure that the photoactive layer does not experience strain when it is flexed into the three-dimensional structure, or experiences only minimal strain that does not significantly affect the performance of the PIN diode. In some embodiments, the layer may have a thickness of 2000 nm or less. This includes embodiments wherein the layer has a thickness of 500 nm or less and further includes embodiments wherein the layer has a thickness of 300 nm or less.

Figure 3:
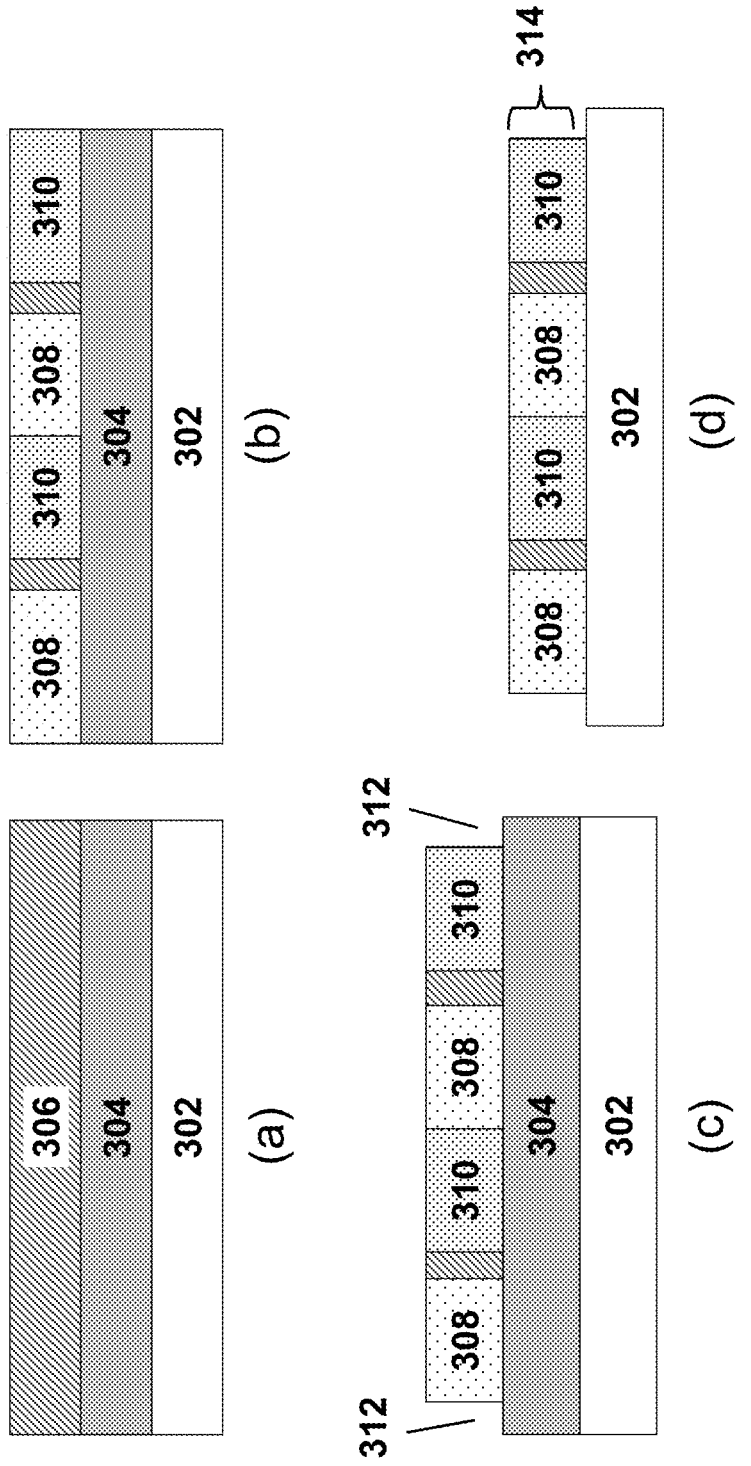
FIG. 3 shows a process for fabricating a lateral PIN diode.
Figure 3:
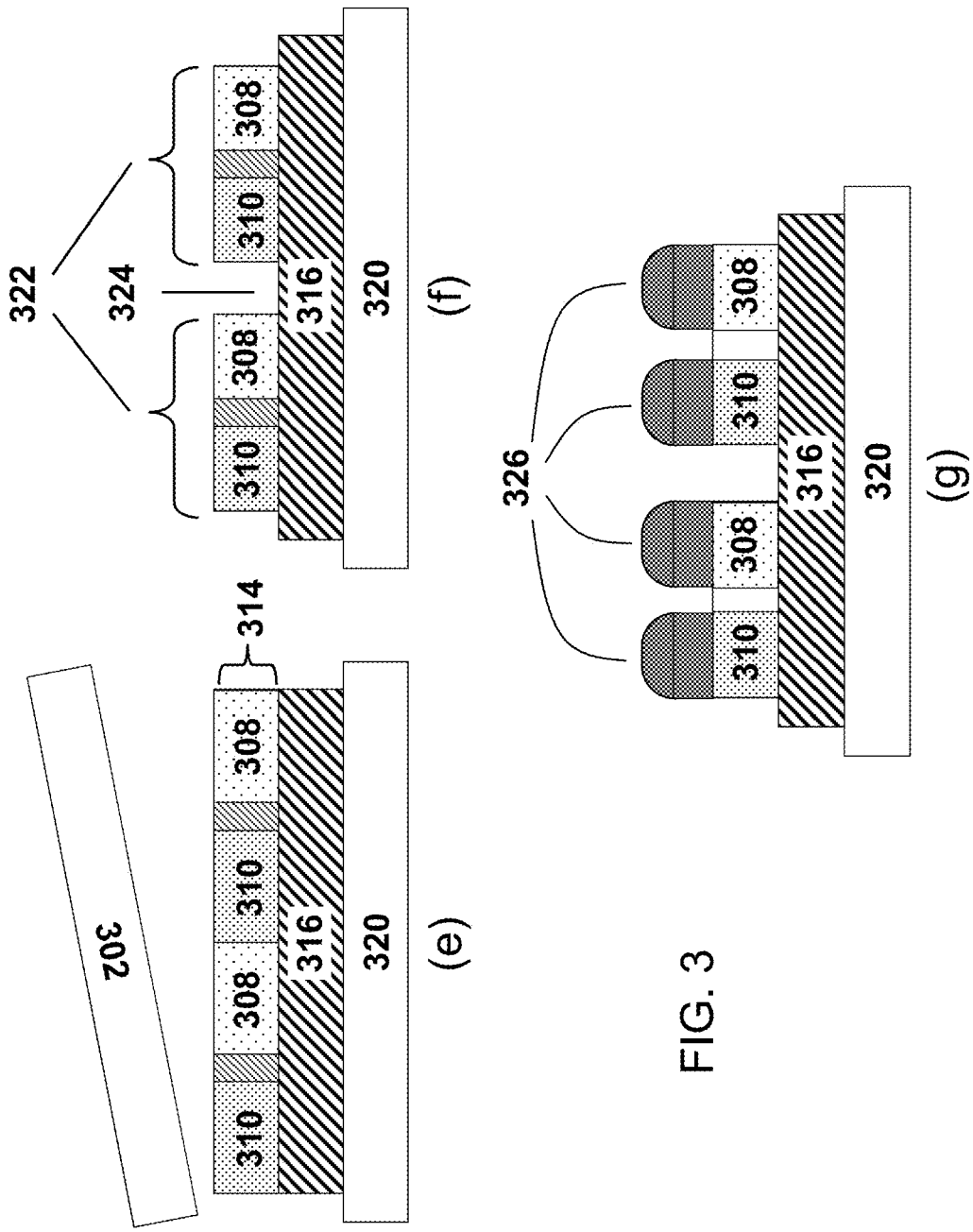

A process for fabricating a lateral PIN diode is illustrated in detail in FIG. 3, panels (a) through (g). As shown in panel (a), the substrate from which the PIN diode is made can be a buried oxide (BOX) semiconductor-on-insulator (SOI) substrate that includes an underlying silicon handle wafer 302, a sacrificial buried silicon oxide layer 304 and a thin intrinsic semiconductor (e.g., Ge) device layer 306. One or more n-type doped regions 308 and one or more p-type doped regions 310 can be defined in the device layer using, for example, ion implantation followed by annealing (panel (b)). A series of holes 312 can then be patterned through the device layer, exposing areas of the underlying BOX layer (panel (c)). The BOX layer can then be exposed to an etching material (e.g., HF) through the holes and etched away, thereby releasing the device layer nanomembrane 314 which settles onto the handle wafer (panel (d)). The released nanomembrane can then be transferred to a flexible substrate (e.g., a PDMS film or an adhesive-coated substrate) 316 to which it adheres by flipping the nanomembrane onto the flexible substrate 316 and peeling away the handle wafer 302 (panel (e)). The flexible substrate may itself be supported on a second supporting substrate 320, such as a glass substrate. Individual, electrically isolated PIN diodes 322 can then be defined in the nanomembrane by patterning and etching channels 324 between neighboring n-type and p-type doped regions (panel (f)). Finally, an electrically conductive material (e.g., a metal film) 326 can be deposited on the n-type and p-type doped regions to provide electrical contacts for the PIN diodes (panel (g)). Optionally, one or more slits 204 may be patterned into the electrically conductive material to accommodate stress when the PIN diodes are flexed.

Another aspect of the invention provides flexible arrays of PIN diodes that can be operated as a photodetector array. The PIN diodes in the array can be, for example, lateral PIN diodes as described herein. In some embodiments, the PIN diodes have photoactive layers with polygon-shaped perimeters having at least five sides arranged in a honeycomb pattern. For the purposes of this disclosure, a honeycomb pattern of PIN diodes refers to a space filling or close packing of the polygon shaped PIN diodes (e.g., hexagons and pentagons), so that the edges of a PIN diode and its neighboring PIN diodes are separated only by the narrow channels which provide them with electrical isolation.

Figure 4:
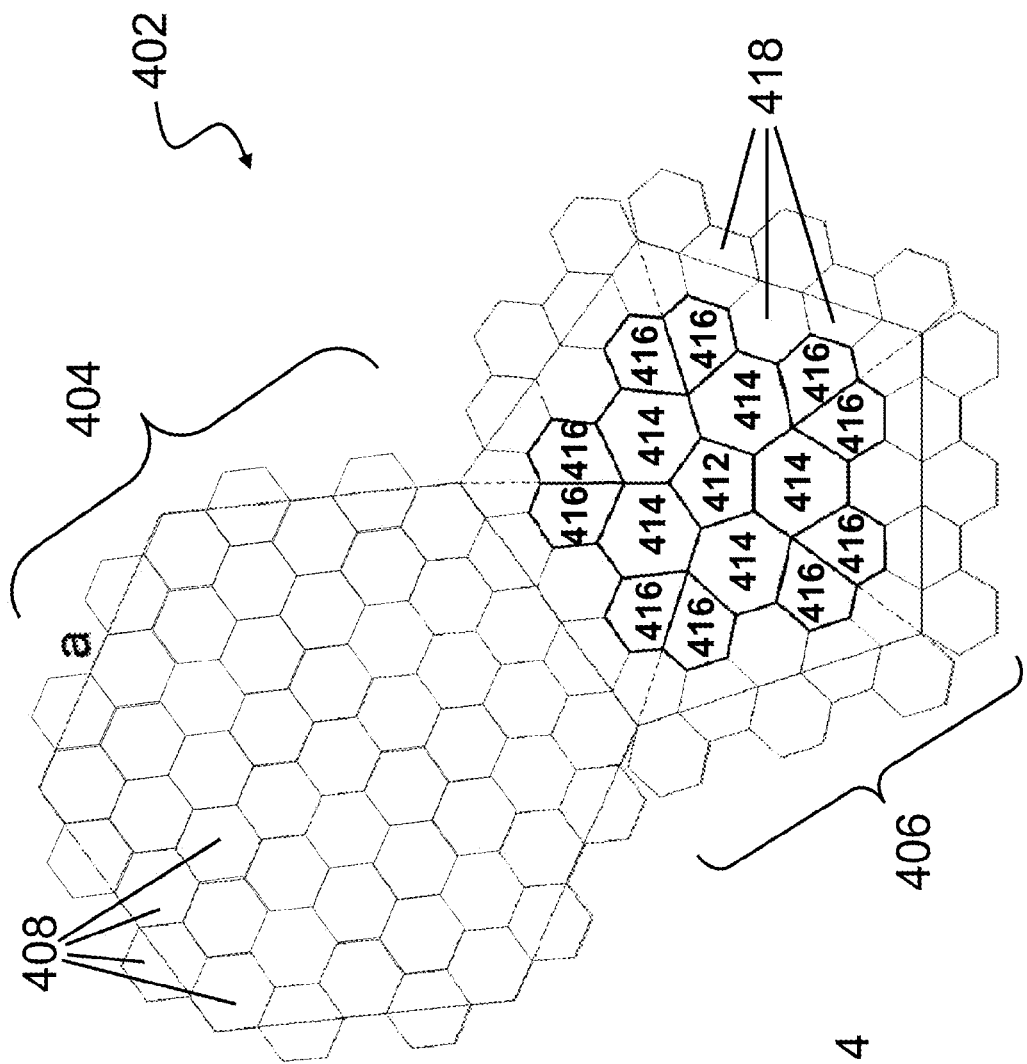
FIG. 4 shows a top view of the top plane of one embodiment of a diode array having two planer sub-sections, delineated in the figure as a hexagonal sub-section and a pentagonal sub-section.

FIG. 4 shows a top view of the top plane of one embodiment of a diode array 402 having two planer sub-sections 404, 406 which are delineated in the figure as a hexagonal sub-section 404 and a pentagonal sub-section 406. Each of the sub-sections is itself composed of a plurality of PIN diodes in a honeycomb arrangement. The hexagonal sub-section is defined by a honeycomb of hexagonal PIN diodes 408. As shown in the figure, the perimeter of the hexagonal sub-section may deviate from a perfect, regular hexagon because the sides of the sub-section are defined by the edges of the hexagonal PIN diodes from which it is formed. For this reason, the hexagonal sub-section may be referred to as "substantially hexagonal." The pentagonal sub-section in this embodiment includes a central pentagonal PIN diode 412, multiple (e.g., five) irregular hexagonal PIN diodes 414 arranged in a ring around the central PIN diode, and multiple (e.g., five) pairs of irregular pentagonal PIN diodes 416 disposed around the circumference of the ring of hexagonal PIN diodes. The hexagonal sub-section further includes multiple hexagonal PIN diodes 418 arranged in a ring around the irregular pentagonal and hexagonal PIN diodes. Because some of the hexagonal PIN diodes 418 extend beyond the perimeter of the hexagonal sub-section delineated in FIG. 4, this sub-section may be referred to as "substantially pentagonal." For the purposes of this disclosure the terms "hexagonal" and pentagonal" will include shapes that are "substantially hexagonal" and "substantially pentagonal", respectively.

In some embodiments, the perimeter of the array defines a plurality of peripheral extensions configured to form a curved surface upon application of a flexing force to the array. In this manner, the array can be formed into a three dimensional array. In one embodiment, the array is configured to form a hemispherical array, wherein the PIN diodes can be operated as photodetectors to provide a hemispherical image sensor. (As used herein, the term hemisphere can include full hemispheres, as well as partial hemispheres.) The flexing force may be applied, for example, by pressing the array against a concave or convex substrate. Such hemispherical image sensors do not suffer from many of the problems associated with distortion which plague conventional, planar imaging devices.

Figure 5:
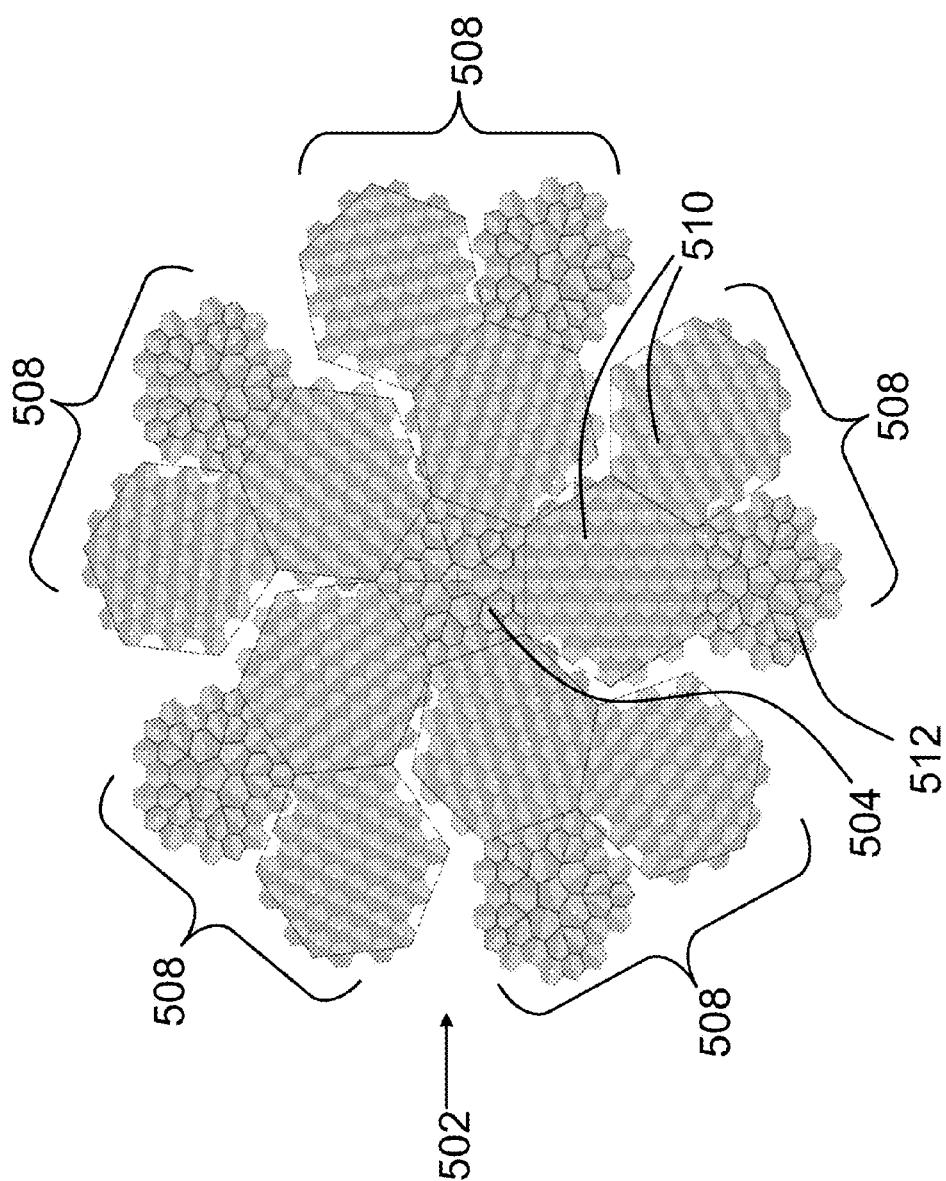
FIG. 5 shows one example of a PIN diode array that is configured to form a hemispherical array upon the application of a flexing force.

FIG. 5 shows one example of a PIN diode array 502 that is configured to form a hemispherical array upon the application of a flexing force. This array includes a central section 504 that is delineated by a pentagon and composed of a plurality of hexagonal and pentagonal PIN diodes. The array further includes five peripheral extensions 508, each comprising two substantially hexagonal sub-sections 510 and a substantially pentagonal sub-section 512. In another embodiment, the central section is a hexagonal section composed of a plurality of hexagonal PIN diodes and the peripheral extensions each comprise two substantially hexagonal sub-sections and a substantially pentagonal sub-section.

Figure 6:
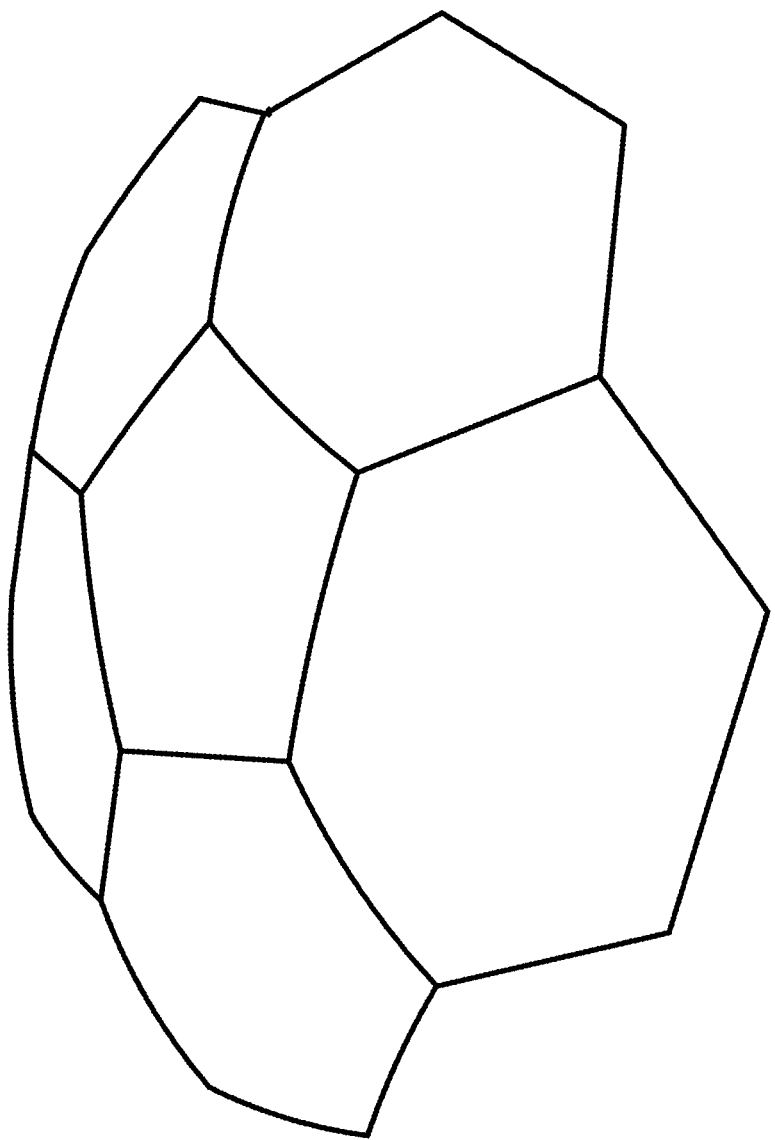
FIG. 6 shows a three dimensional photodetector array in the shape of a partial hemisphere formed from the PIN diode array of FIG. 5.

The shape of the three-dimensional PIN diode array that forms upon the application of a flexing force may deviate from a perfect hemisphere due to the fact that the nanomembranes making up the photoactive layers of the PIN diodes and the sub-sections making up the array may not adopt a perfectly hemispherical shape, as shown in FIG. 6. In view of this deviation, the three-dimensional array may be considered to be "substantially hemispherical." For the purposes of this disclosure, the term "hemispherical" will include shapes that are "substantially hemispherical."

Figure 7:
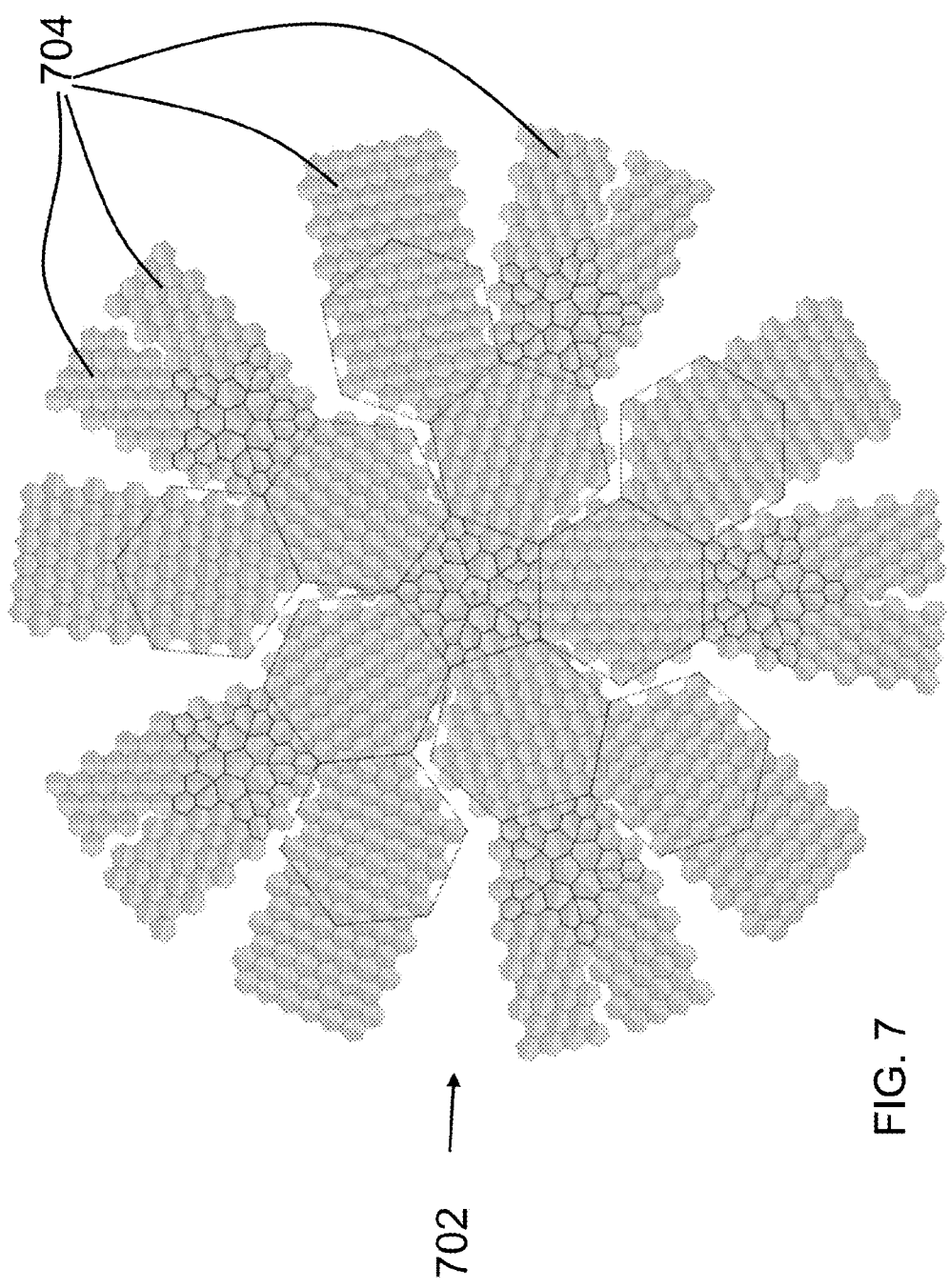
FIG. 7 shows an array of PIN diode photodetectors configured to provide a three-dimensional sensor array in the form of a hemisphere on a cylindrical base.

The present arrays may be configured to provide three-dimensional shapes other than hemispheres. For example, FIG. 7 shows an array of PIN diodes 702 configured to provide a hemisphere on a cylindrical base (i.e., a "silo-shaped" three-dimensional array.) This array is similar to that shown in FIG. 5, but further includes a plurality of substantially rectangular sub-sections 704 around its perimeter. These substantially rectangular sub-sections come together to form the cylindrical base of the three-dimensional array.

Yet another aspect of the invention provides a flexible electrical switch fabricated from at least two lateral PIN diodes connected in a switch configuration. Example 2, illustrates one embodiment of a switch that includes two flexible lateral PIN diodes in a shunt-series configuration on a flexible polymeric substrate.

Yet another aspect of the invention provides a flexible laser radar (LADAR) device comprising a flexible vertical cavity light emitting source surrounded by a ring of flexible photodetectors. In one embodiment of this aspect, the flexible vertical light emitting source can include a lower reflector comprising a first patterned membrane comprising an array of holes, an active region disposed over the lower reflector and spaced from the lower reflector by at least one electrically conductive contact and an upper reflector comprising a second patterned membrane comprising an array of holes disposed over the active region and spaced from the active region by at least one electrically conductive contact. Methods of making flexible vertical cavity light emitting sources are described in U.S. patent application Ser. No. 12/412,628, filed on Mar. 29, 2009, the entire disclosure of which is incorporated herein by reference. Briefly, the vertical cavity light emitting sources can be monolithically (heterogeneously) integrated with a variety of substrates, including silicon wafers. In particular, vertical cavity light emitting sources based on, for example, Group III-V semiconductors can be provided on silicon substrates. The stacking approach makes it possible to place electrical contacts between the active region and the reflectors of the vertical cavity light emitting sources ("intra-cavity contacts"), such that the reflectors are spaced from the active region by the electrical contacts. This design minimizes the surface state impact from the reflector/active region interfaces since there is no current flow between the stacked surfaces. Thus, an intra-cavity electrical contact design facilitates efficient electrical injection. The process for fabricating a stacked membrane vertical cavity light emitting source is based on the stacking and bonding of the reflectors and active region that make up the vertical cavity light emitting source, wherein the reflectors and active region can be fabricated from membranes on separate substrates, released from those substrates, aligned, stacked and bonded.

The photodetectors in the LADAR devices can comprise diodes comprising a flexible layer of single-crystalline semiconductor. In one embodiment of the LADAR device, flexible lateral PIN diodes of the type described herein can be used as the photodetectors in the LADAR devices. In another embodiment, high-speed, high-efficiency PIN diodes of the type described in U.S. Patent Application Publication number 2007/0284688, filed on Jun. 13, 2006, can be used as the photodetectors.

A plurality of the LADAR devices can be arranged in a honeycomb pattern on a substrate to provide a LADAR array. Like the photodiode arrays described herein, the LADAR arrays can be substantially two-dimensional arrays having a perimeter that defines a plurality of extensions configured to form a curved, three-dimensional LADAR array upon the application of a flexing force. In some embodiments of a curved LADAR array, at least a portion of the array forms a hemispherical array. In other embodiments, the flexible LADAR array can form a spherical array. Such embodiments can provide ultra compact omnidirectional, three-dimensional LADAR systems, useful for a variety of applications, including defense surveillance.

Figure 10A:
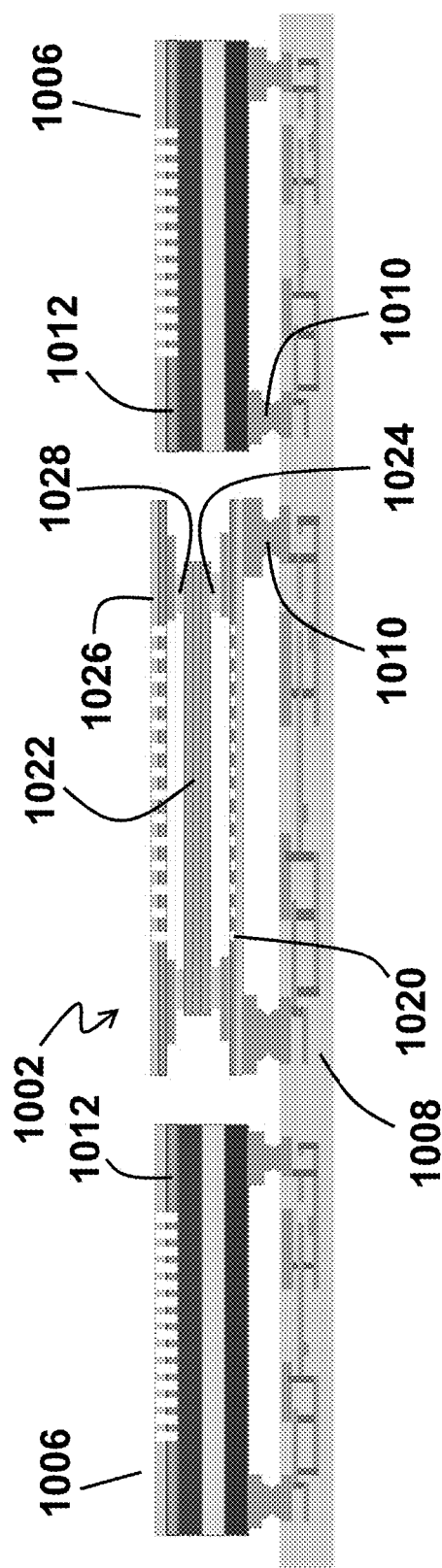
FIG. 10(a) shows a cross-sectional view of a LADAR device including a central flexible vertical cavity light emitting source surrounded by a plurality of flexible photo detectors.
Figure 10B:
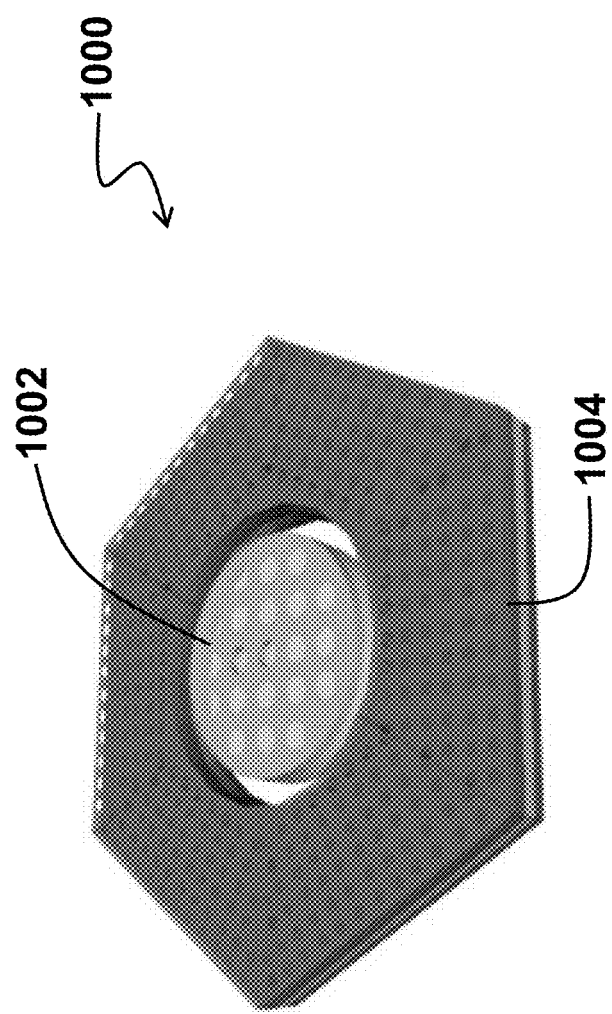
FIG. 10(b) is a schematic image of the LADAR device of FIG. 10(a).
Figure 11:
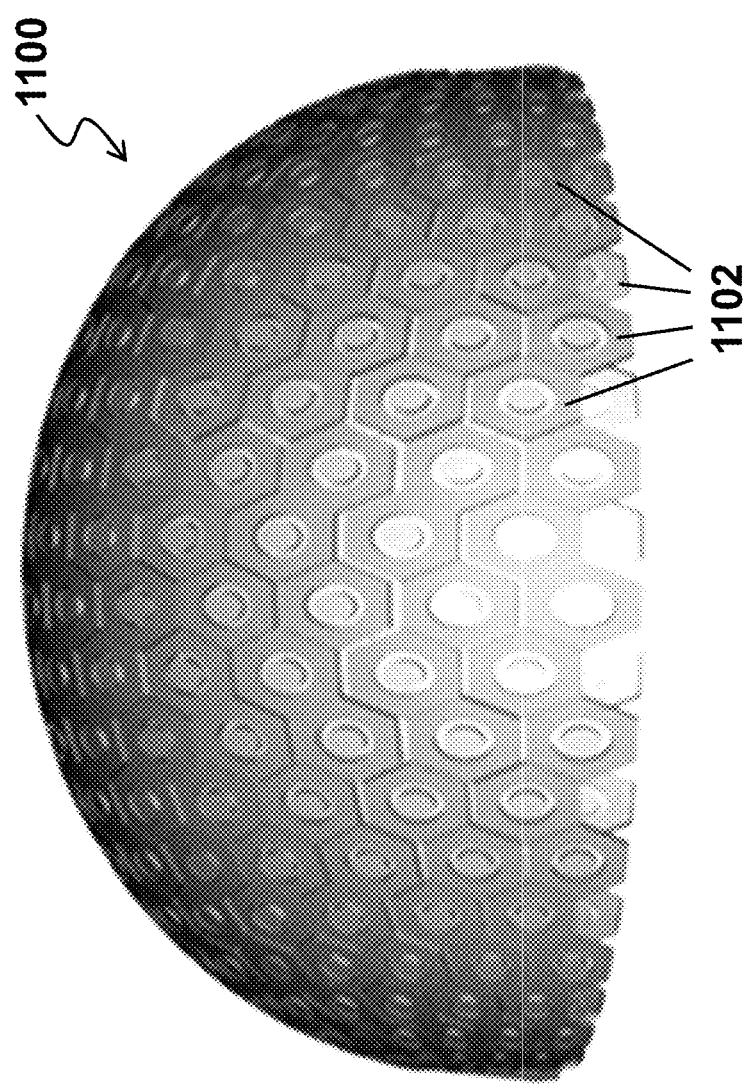
FIG. 11 shows a schematic diagram a substantially hemispherical LADAR array.

FIGS. 10(a) and (b) show schematic diagrams of a LADAR device 1000 that includes a flexible surface normal laser 1002 in the center of a ring 1004 of photodetectors 1006. The LADAR device can be connected to a substrate comprising an electrical interconnect network 1008 via electrically conductive contacts 1010. The cross sectional view of the LADAR device is shown in FIG. 10(b). The lasers can be designed to operate in the eye-safe wavelength range of 1.5-1.6 µm. A plurality of the LADAR devices of FIG. 10 can be integrated with the underlying substrate 1008 to provide a LADAR array. In such an array, different lasers in the array can be designed to emit light at different wavelengths. The laser beams emitted from the laser in each LADAR device can be diverged with a defocusing lens (not shown) in order to cover a certain defined, but limited, solid angle in space. Combined together, all the lasers can be designed to cover an entire, three-dimensional region of space (e.g., a hemispherical or spherical region) without any blind spots. FIG. 11 is an image of a three-dimensional LADAR array 1100 that includes a plurality of LADAR devices 1102 arranged in a honeycomb pattern in a substantially hemispherical shape.

In the embodiment depicted in FIGS. 10(a) and (b), the surface normal laser includes a lower reflector 1020 comprising a first patterned membrane comprising an array of holes, an active region 1022 spaced from the lower reflector by at least one electrically conductive contact 1024 and an upper reflector 1026 comprising a second patterned membrane comprising an array of holes and spaced from the archive region by at least one electrically conductive contact 1028.

The LADAR arrays can be used to detect objects in motion and, therefore, are useful in applications such as unmanned aerial vehicles (UAVs), micro air vehicles (MAVs), mobile robots, or mobile devices integrated in soldier helmets. During operation, laser light from the LADAR array strikes a moving target and is reflected back to the LADAR array, where it is detected by the photodetectors in the array. If different photodetectors in the LADAR device are tailored to detect different wavelengths of light (i.e., if the photodetectors are wavelength-selective), the photodetectors in the array can be used to determine from which laser the light was emitted and this information can be used to detect the speed, direction and even size of the detected object.

The photodetectors in the present LADAR devices can be made wavelength-selective by incorporating surface-normal optical filters onto the photodetectors. An example of a suitable optical filter based on Fano resonances is a patterned single-crystalline silicon nanomembrane 1012. Filters of this type are described in Yang et al., Electronics Letters, vol. 44, no. 14 (2008) and in U.S. patent application Ser. No. 12/412, 628, filed on Mar. 29, 2009. Such filters can be patterned into a thin layer of single-crystalline silicon, such as the silicon device layer of a silicon-on-insulator substrate, then released and transferred onto a PIN diode. Thus, the wavelength selectivity of each photodetector in a LADAR system can be tailored based on the pattern and dimensions of the filter associated therewith.

EXAMPLES

Example 1

Flexible Photodetector

This example reports the development of flexible photodetectors using single-crystalline germanium (Ge) nanomembranes. Ge is of interest for photodetection due to its high absorption coefficients across a large range of wavelengths. Because of its high absorption coefficient, Ge can be used in a nanomembrane form in order to achieve high bendability, while still realizing high photoresponsivity for incident light. The small bandgap of Ge is compatible with making photodetectors for optical communication wavelengths of 1.3 and 1.55 µm. Moreover, the hole mobility and low-field drift velocity of Ge are the highest among all types of semiconductors. In this example, the flexible Ge-nanomembrane photodetectors are configured as lateral Ge-nanomembrane PIN photodiodes in the visible wavelength regime. These single-crystal Ge-nanomembrane photodiodes can be monolithically integrated with flexible and transparent plastic substrates and can be used for flexible image sensors where tunable visual field can be achieved by bending the array of photodiodes into different curvatures and shapes.

The starting material was a 4-inch Ge-on-insulator (GOI) wafer which was fabricated by Smart Cut™ technology at Soitec and has 250-nm single-crystal Ge template layer on top of a 200-nm buried oxide (BOX) layer. Heavily doped n-type and p-type regions ($n^+$, $p^+$) of the lateral PIN photodiodes were formed by ion implantations at designated regions on the GOI substrate in order to form low-resistance Ohmic contacts in the later fabrication stage. The ion implantation conditions of the $n^+$ and $p^+$ regions were phosphorus with a dose of $4\times10^{15}$ cm$^{-2}$ at 40 keV and boron with a dose of $4\times10^{15}$ cm$^{-2}$ at 60 keV, respectively. The physical separations between the $n^+$ and $p^+$ regions determine the i-layer width (wi) of the PIN diodes. Smaller i-region will result in a higher PIN speed, but a reduced absorption efficiency. In this example, the wi is chosen to be 10 µm. The implants were annealed by rapid thermal annealing (RTA) at 700° C. for 20 sec in $N_2$ ambient after depositing a sacrificial oxide layer by plasma-enhanced chemical vapor deposition (PECVD) to prevent dopant out-diffusion. After stripping off the sacrificial PECVD oxide layer in dilute hydrofluoric (HF) acid, the Ge template layer was patterned into 30-µm wide strips with optical photolithography and reactive-ion etching (RIE) using $SF_6$ and $O_2$ gas mixture. The photoresist that masked the Ge strips was then removed with oxygen plasma treatment and acetone.

Figure 8:
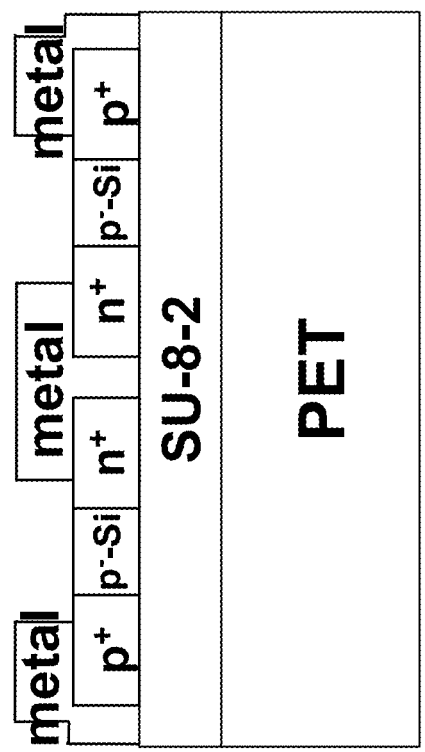
FIG. 8 shows a schematic cross-sectional diagram of a lateral PIN diode constructed from a silicon nanomembrane, as described in Example 2.

To transfer the Ge strips onto a plastic substrate, a dry printing technique was employed. In short, the BOX was first removed by immersing in 49% aqueous HF for 1 hour. The Ge nanomembranes, which were no longer bonded with the BOX, settled down and registered their positions on the Si handle substrate of the GOI via van der Waals' forces. The released and settled strips were then brought face-to-face against a piece of 175-µm thick polyethylene terephthalate (PET) substrate having a layer of adhesive SU-8-2 epoxy (~1.8 μm, Microchem) spun on its surface. The Ge nanomembranes were transferred to the PET substrate by gently pressing and peeling off the Si handling substrate. Due to the thinness of the BOX, the position of the transferred Ge nanomembranes remains unchanged during the BOX removal and the transfer, which facilitates the alignment of the subsequent mask layers. Finally, the SU-8-2 was exposed under UV light and became fully cross-linked after baking at 115° C. The widths of the n+ and p+ regions of the nanomembranes were defined on the PET substrate by optical photolithography and RIE ($SF_6/O_2$) etching down to the SU-8-2 layer. Finally, the interdigitated n- and p-electrodes were formed on the n+ and p+ regions, respectively, by a single-step e-beam evaporation of 40/500-nm Cr/Au layers with subsequent liftoff. FIG. 8 shows a cross-sectional view of a schematic diagram of one of the finished lateral Ge-nanomembrane PIN photodiodes. The distance between the metal electrodes and the i-regions was fixed at 2 μm. No passivation or anti-reflection layer was used in this study. Because the high-temperature n+ and p+ formation steps were completed on the GOI substrate, the highest temperature the PET encountered during the entire fabrication was lower than 120° C.

The contact resistivity and sheet resistance of the ion-implantation doped regions were evaluated by the transfer length method (TLM) and were found to be $1.7 \times 10^{-4}$ Ω-$cm^2$, 67.5 Ω/square for the n+ region and $9.2 \times 10^{-5}$ Ω-$cm^2$, 250 Ω/square for the p+ region, respectively. An HP4155A semiconductor parameter analyzer was used to measure the photocurrent of the flexible Ge photodiodes. The photodiodes were reverse-biased up to 5 V under both dark and illumination conditions from the front side. Four different visible lasers with wavelengths (λ) of 411, 543.5, 594, and 633-nm were used for illumination. The photocurrent increased slightly with the higher reverse-bias voltage regardless of the incident wavelength. The photocurrent reached 1.55 mA/$mm^2$ under the illumination of the 633-nm laser with a power density of 7.2 mW/$mm^2$ at −1 V. The measured dark current was lower than $3 \times 10^{-7}$ A up to −5 V bias and was weakly dependent on the reverse-bias voltage. The low dark current suggests the very low density of dislocations and point defects in the transferred Ge nanomembranes, even though the finished flexible photodetectors were bent down to a very small radius many times. As a result, the trap-assisted tunneling that contributes to high dark current under reverse bias conditions was suppressed. I-V curves of a $10 \times 1200$-μ$m^2$ photodiode under different incident power levels were attained by attenuating the power from the 633-nm laser. It was found that the measured current was proportional to the incident power, indicating that the flexible Ge-nanomembrane PIN photodiodes were viable as photo sensors.

The external quantum efficiency (QE) of the flexible photodetectors was extracted from the photocurrent measurements at different reverse bias voltages. The external QE exhibited strong wavelength dependence and decreased sharply from around 42% at λ=633 nm to around 5% at λ=411 nm. The roll-off was presumably due to the very shallow penetration depth for the short-wavelength incident light. According to the extinction coefficient provided in E. D. Palik, Handbook of Optical Constants of Solids (Academic Press, Inc., Orlando, 1985), the penetration depth of the 411-nm wavelength light into Ge was only 15 nm.

In summary, this example demonstrates flexible multi-wavelength photodetectors by monolithically integrating single-crystal Ge nanomembranes with flexible plastic substrates. By forming heavily doped regions on an GOI substrate with ion implantation and high-temperature annealing before releasing the Ge nanomembranes, lateral Ge-membrane PIN photodiodes on low-temperature and low-cost PET substrates have been realized. A proper surface passivation may improve the QE at the short wavelengths. The study demonstrates the potential of flexible imaging applications using single-crystal Ge nanomembranes at very low or even zero bias conditions.

Example 2

Flexible Switch

This example illustrates the fabrication of bendable microwave switches formed from single-crystal Si nanomembranes (SiNM) on a plastic substrate. In particular, this example describes a single-pole single-throw switch, composed of two PIN diodes connected in a shunt-series configuration. The switches described herein can be used in high-frequency applications in a number of consumer and military systems. As described in detail below, the switches can be fabricated using a combination of high- and low-temperature processes on transferable silicon nanomembranes (SiNMs) to realize low parasitic resistance, high performance flexible RF switches configured with flexible PIN diodes. The process of transferring the SiNMs and fabricating the PIN-diode switches is compatible with the process used to fabricate microwave thin-film transistors (TFTs). (See, for example H.-C. Yuan, and Z. Ma, Appl. Phys. Lett. 89, 212105 (2006)). The compatibility facilitates the integration of flexible switches and TFTs on a single flexible substrate.

In this example, a lightly-doped p-type Si (001) UNI-BOND® SOI substrate with a 200-nm silicon template layer and a 200-nm buried oxide (BOX) layer was used as the starting material. Heavily doped n- and p-type (n+ and p+) regions were formed on designated regions defined by optical photo-lithography followed by ion implantation with conditions of phosphorus, $4 \times 10^{15}$ $cm^{-2}$ at 40 keV, and boron, $4 \times 10^{15}$ $cm^{-2}$ at 25 keV, respectively. The implanted sample was then annealed in a horizontal furnace at 850° C. for 45 min in $N_2$ ambient. To facilitate the subsequent transfer, the 200-nm Si template layer was patterned into 30-μm wide strips separated by 20-μm gap using photo-lithography and plasma dry etching ($SF_6/O_2$) down to the BOX layer. After stripping off the photoresist in piranha ($H_2SO_4:H_2O_2$=4:1), the BOX layer was removed by immersing in 49% HF. As the oxide etching proceeded from the opening gap, the free-standing part of the patterned SiNM settled down and bonded with the Si handle substrate via weak van der Waals' forces until the underlying oxide was completely removed. This so-called "in-place bonding" ensured that the Si strips kept their spatial registration as they were patterned. The now weakly-bonded SiNM (in strip form) was then rinsed thoroughly with DI water and subsequently printed face-to-face to a piece of polyethylene terephthalate (PET) substrate that had been spun with a layer of SU-8 epoxy. The bonding force between SiNM and epoxy is stronger than the Si-to-Si bonding so the SiNM was brought facing down onto the PET substrate. The position of the patterned Si-strips did not change throughout the BOX removal and printing transfer process so the pre-doped regions could be further registered with the rest of the mask layers even after they were transferred to the plastic substrate. This direct flip-transfer method to transfer SiNMs from their original silicon-on-insulator (SOI) substrate to a new host substrate, results in higher fidelity registration of SiNMs compared to a soft-stamp-assisted transfer. However, a thin BOX in the SOI is desirable in order to avoid the use of anchors to prevent position shifts of the SiNMs during their release.

Figure 9:
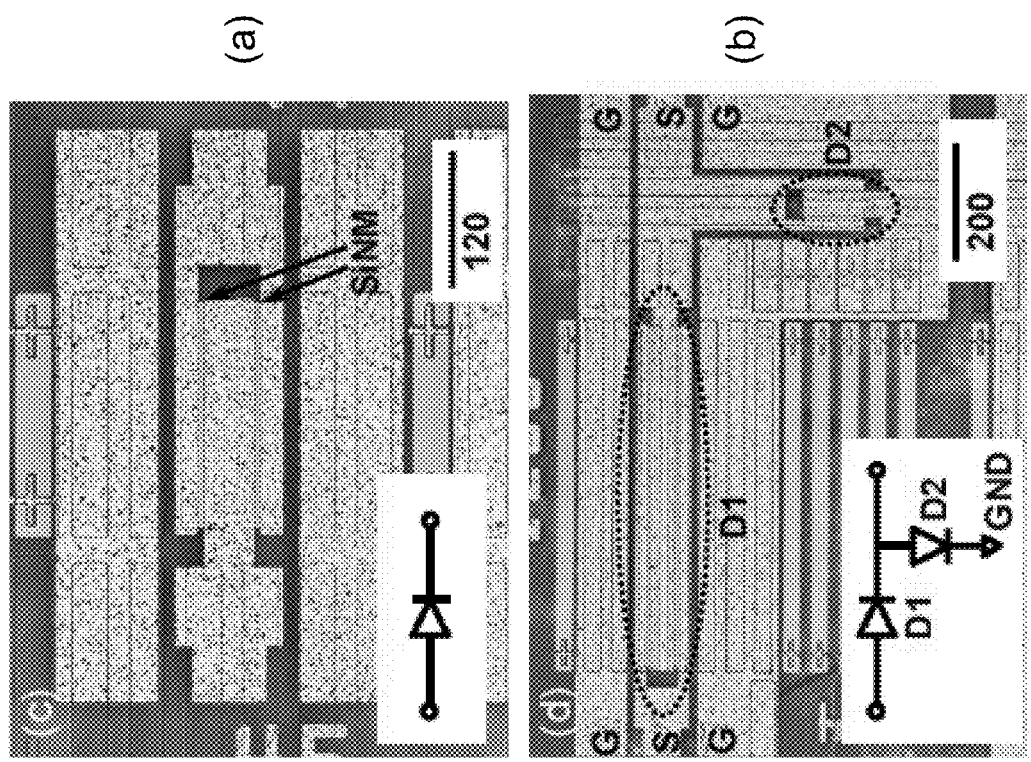
FIG. 9(a) shows an optical-microscope image of a lateral PIN diode constructed from a silicon nanomembrane, as described in Example 2.
FIG. 9(b) shows an optical-microscope image of a single-pole, single-throw switch, as described in Example 2.

The fabrication of the PIN diodes on the flexible PET substrate was finished by forming 40/500-nm Cr/Au metal stacks on the pre-doped n+ and p+ regions. So unlike the conventional vertical PIN diode structure, the p-, intrinsic (i, unintentionally doped), and n-regions in this example were arranged laterally on the SiNM. The thinness of the SiNM enabled the planar-type structure to have high flexibility and allowed for severe bending during implementation. The width of the i-region was determined by the separation between photo-lithographically defined p+ and n+ regions and was chosen to be 2 µm in this example to achieve high-frequency response while maintaining proper breakdown voltages for power handling Consequently, the active diode area was determined by multiplying the width of the p+ (or n+) region with the thickness of the SiNM (200 nm) and it ranged from 80 to 320 $\mu m^2$. FIG. 8 presents the schematic cross-section of the lateral SiNM PIN diode. FIGS. 9(a) and 9(b) show optical-microscope images of a finished lateral SiNM PIN diode with an area of 80 $\mu m^2$ and a shunt-series single-pole, single-throw (SPST) switch with the corresponding circuit diagram in the insets. Diode 1 (D1) and diode 2 (D2) on the shunt-series switch have areas of 240 and 40 $\mu m^2$, respectively. The i-region width in this example was kept as 2 µm.

DC characteristics of the flexible SiNM PIN diodes were measured with an HP4155B semiconductor parameter analyzer and RF characteristics were measured with an Agilent E8364A network analyzer using 100-µm pitch GSG probes. The reference plane was calibrated to the probe tip by SOLT calibration using impedance standard substrate from DC to 40 GHz. Typical diode rectifying characteristics were demonstrated without apparent breakdown up to 10-V reverse-bias. The ideal factor n was extracted to be 1.53 and may be attributed to high recombination probability caused by the large periphery-to-area ratio inherent to the lateral PIN diode.

Small-signal scattering (S)-parameters of the series SiNM PIN diodes were measured under different forward-bias current (ON states) and zero bias (OFF state). The ON state had a forward-biased current ($I_f$) at 10, 20, and 30 mA and the OFF state was at zero bias. The measured S21 under ON and OFF states were equivalent to the insertion loss and isolation of the series PIN diodes, whereas the S11 was the return loss. Due to the symmetrical and reciprocal nature of the single series PIN diode the measured S12 (S22) was identical to S21 (S11). Insertion loss on both small- and large-area series SiNM PIN diodes decreased with increasing $I_f$ and was less than 0.94 and 0.79 dB from DC up to 20 GHz at $I_f$=30 mA for diode areas of 80 and 240 $\mu m^2$, respectively. Isolation higher than 19 dB was exhibited on the 80-$\mu m^2$ series SiNM PIN diode at zero in the frequency range from DC to 5 GHz. The large area (240 $\mu m^2$) diode had lower isolation and was better than 11.6 dB up to 5 GHz. When a reverse voltage bias (from 1 to 8 V) was applied to the series SiNM PIN diodes, isolation showed negligible improvement (<1 dB). This is strong evidence that the lateral SiNM PIN diodes had fully depleted i-regions and did not require negative voltage bias for the optimal isolation during operation.

The large-signal power performance for the 240-$\mu m^2$ series SiNM PIN diode was measured at 6 GHz with a bias condition of $I_f$=20 mA. A linear dependence between the input power ($P_{IN}$) and the output power ($P_{OUT}$) was demonstrated for input power ranging from 7.5 to 22.5 dBm. No gain compression was observed for the lateral SiNM PIN diode within the measured power range. The average large-signal gain was around -1.1 dB and agreed very well with the insertion loss (0.91 dB) measured by small-signal S-parameters at the same frequency and bias conditions.

An SPST switch having a shunt-series configuration was fabricated using lateral SiNM PIN diodes of the type described above. The areas of the series (D1) and shunt (D2) PIN diodes were 400 and 40 $\mu m^2$, respectively. The ON state small-signal S-parameters were characterized in the same manner as for the series PIN diodes with $I_f$ of 10, 20, and 30 mA applied to the input end (port 1, D1) of the switch. OFF state responses were measured at zero bias and with a forward-bias current of 10 mA ($I_2$) applied on the shunt PIN diode (D2). The frequency responses for the shunt-series SiNM PIN SPST switch were measured. For those bias conditions other than $I_2$=10 mA the shunt-series switch exhibited a response similar to that of the 240-$\mu m^2$ single series PIN diode. When the switch was biased at $I_2$=10 mA (D1=OFF, D2=ON), D2 effectively created a short path and, as the result, isolation was substantially improved from 10.8 dB at zero bias to 22.8 dB. Similarly, a discrepancy occurred on S11 and S22 under $I_2$=10 mA bias conditions. Return loss on port 1 (S11) was further reduced compared with that of the zero-bias condition due to the improved isolation, whereas return loss on port 2 (S22) was reduced since D2 was tied to the ground electrode.

In summary, this example demonstrates high-frequency microwave flexible single-crystal SiNM PIN diodes and switches that can be monolithically integrated on low-cost plastic substrates with high-performance active components. The lateral SiNM PIN diodes exhibited typical rectifying characteristics. Insertion loss and isolation better than 0.9 and 19.6 dB from DC to 5 GHz were demonstrated on a 80-$\mu m^2$ series PIN diode. A SPST shunt-series PIN diode switch achieved insertion loss better than 0.6 dB and isolation higher than 22.8 dB up to 5 GHz. This example demonstrated the possibility of using SiNM PIN diodes for microwave passive components, which is an important advance for realizing monolithic microwave integrated circuits on flexible substrates. These PIN diodes and switches can serve as the key components needed in phase shifters, and limiters in microwave circuits and photodetectors.

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A non-planar photodiode array having a three-dimensional curvature and comprising a plurality of PIN diodes on a support substrate underlying the plurality of PIN diodes, each PIN diode comprising a layer of single-crystalline semiconductor, the plurality of PIN diodes comprising PIN diodes comprising layers of single-crystalline semiconductor having a hexagon-shaped perimeter and PIN diodes comprising layers of single-crystalline semiconductor having a pentagon-shaped perimeter, wherein the PIN diodes comprising layers of single-crystalline semiconductor having a hexagon-shaped perimeter and the PIN diodes comprising layers of single-crystalline semiconductor having a pentagon-shaped perimeter are arranged in a honeycomb pattern, and further wherein the PIN diodes and the support substrate are sufficiently flexible that the photodiode array can be converted from a planar photodiode array to the non-planar photodiode array upon the application of a flexing force.

2. The photodiode array of claim 1, wherein the non-planar diode array having a three-dimensional curvature comprises a hemispherical diode array.

3. The photodiode array of claim 1, wherein the PIN diodes are lateral PIN diodes, the lateral PIN diodes comprising an intrinsic region disposed laterally between an n-type doped region and a p-type doped region, the intrinsic region comprising:
   (a) a central section located at the center of the hexagon-shaped or pentagon-shaped layer of single-crystalline semiconductor;
   (b) a first flanking section extending from the central section to the perimeter of the layer of single-crystalline semiconductor; and
   (c) a second flanking section, disposed opposite the first flanking section and extending from the central section to the perimeter of the layer of single-crystalline semiconductor; wherein the central section is wider than the first and second flanking sections.

4. The photodiode array of claim 3, wherein the n-type doped region and the p-type doped region extend through the layer of single-crystalline semiconductor.

5. The photodiode array of claim 3, wherein the central section has a circular perimeter.

6. The photodiode array of claim 1, wherein the plurality of PIN diodes comprises PIN diodes comprising a layer of single-crystalline semiconductor having a non-equilateral hexagon-shaped perimeter and PIN diodes comprising a layer of single-crystalline semiconductor having a non-equilateral pentagon-shaped perimeter.

7. The photodiode array of claim 1, wherein the plurality of PIN diodes comprises a PIN diode comprising a layer of single-crystalline semiconductor having a regular-pentagon shaped perimeter and six PIN diodes, each comprising a layer of single-crystalline semiconductor having a non-equilateral hexagon-shaped perimeter, formed in a ring around the PIN diode comprising the layer of single-crystalline semiconductor having an equilateral pentagon-shaped perimeter.

8. The photodiode array of claim 7, further comprising five pairs of PIN diodes, each comprising a layer of single-crystalline semiconductor having a non-equilateral pentagon-shaped perimeter, disposed around the circumference of the six PIN diodes formed in the ring.

9. The photodiode array of claim 1, wherein each of the layers of single-crystalline semiconductor has a thickness of no greater than about 400 nm.

10. The photodiode array of claim 1, wherein each of the layers of single-crystalline semiconductor is a layer of single-crystalline germanium.

11. The photodiode array of claim 1, wherein each of the layers of single-crystalline semiconductor has a plurality of holes extending therethrough.

12. The photodiode array of claim 1, wherein the support substrate is a polymeric film.

13. The photodiode array of claim 1, wherein the support substrate is a polymeric film or a metal foil and the plurality PIN diodes are disposed on the same surface of the support substrate.

14. A photodiode array comprising a plurality of PIN diodes configured in the form of a non-planar diode array having a three-dimensional curvature, each PIN diode comprising a layer of single-crystalline semiconductor, the plurality of PIN diodes comprising PIN diodes comprising layers of single-crystalline semiconductor having a hexagon-shaped perimeter and PIN diodes comprising layers of single-crystalline semiconductor having a pentagon-shaped perimeter; wherein the PIN diodes comprising layers of single-crystalline semiconductor having a hexagon-shaped perimeter and the PIN diodes comprising layers of single-crystalline semiconductor having a pentagon-shaped perimeter are arranged in a honeycomb pattern; and further wherein the plurality of PIN diodes comprises PIN diodes comprising a layer of single-crystalline semiconductor having a non-equilateral hexagon-shaped perimeter and PIN diodes comprising a layer of single-crystalline semiconductor having a non-equilateral pentagon-shaped perimeter.

15. A photodiode array comprising a plurality of PIN diodes configured in the form of a non-planar diode array having a three-dimensional curvature, each PIN diode comprising a layer of single-crystalline semiconductor, the plurality of PIN diodes comprising PIN diodes comprising layers of single-crystalline semiconductor having a hexagon-shaped perimeter and PIN diodes comprising layers of single-crystalline semiconductor having a pentagon-shaped perimeter; wherein the PIN diodes comprising layers of single-crystalline semiconductor having a hexagon-shaped perimeter and the PIN diodes comprising layers of single-crystalline semiconductor having a pentagon-shaped perimeter are arranged in a honeycomb pattern; and further wherein the plurality of PIN diodes comprises a PIN diode comprising a layer of single-crystalline semiconductor having an equilateral pentagon-shaped perimeter and six PIN diodes, each comprising a layer of single-crystalline semiconductor having a non-equilateral hexagon-shaped perimeter, formed in a ring around the PIN diode comprising the layer of single-crystalline semiconductor having an equilateral pentagon-shaped perimeter.

\* \* \* \* \*